United States Patent
Aoki

(10) Patent No.: US 10,308,560 B2
(45) Date of Patent: Jun. 4, 2019

(54) HIGH THERMAL CONDUCTIVE SILICON NITRIDE SINTERED BODY, AND SILICON NITRIDE SUBSTRATE AND SILICON NITRIDE CIRCUIT BOARD AND SEMICONDUCTOR APPARATUS USING THE SAME

(71) Applicants: KABUSHIKI KAISHA TOSHIBA, Tokyo (JP); TOSHIBA MATERIALS CO., LTD., Yokohama-Shi, Kanagawa-Ken (JP)

(72) Inventor: Katsuyuki Aoki, Kanagawa (JP)

(73) Assignees: KABUSHIKI KAISHA TOSHIBA, Tokyo (JP); TOSHIBA MATERIALS CO., LTD., Tokyo (JP)

( * ) Notice: Subject to any disclaimer, the term of this patent is extended or adjusted under 35 U.S.C. 154(b) by 10 days.

(21) Appl. No.: 15/545,586

(22) PCT Filed: Jan. 19, 2016

(86) PCT No.: PCT/JP2016/051427
§ 371 (c)(1),
(2) Date: Jul. 21, 2017

(87) PCT Pub. No.: WO2016/117553
PCT Pub. Date: Jul. 28, 2016

(65) Prior Publication Data
US 2018/0002237 A1   Jan. 4, 2018

(30) Foreign Application Priority Data
Jan. 23, 2015 (JP) ................................ 2015-011334

(51) Int. Cl.
*B32B 27/02* (2006.01)
*C04B 35/584* (2006.01)
(Continued)

(52) U.S. Cl.
CPC .......... *C04B 35/584* (2013.01); *C04B 37/026* (2013.01); *H01L 23/12* (2013.01); *H01L 23/13* (2013.01); *H01L 23/15* (2013.01); *H01L 23/36* (2013.01); *H01L 23/3735* (2013.01); *H05K 1/03* (2013.01); *H05K 1/05* (2013.01); *C04B 2235/3205* (2013.01); *C04B 2235/3206* (2013.01); *C04B 2235/3208* (2013.01); *C04B 2235/3224* (2013.01); *C04B 2235/3225* (2013.01); *C04B 2235/3232* (2013.01); *C04B 2235/3244* (2013.01); *C04B 2235/3248* (2013.01); *C04B 2235/3249* (2013.01); *C04B 2235/3878* (2013.01); *C04B 2235/3895* (2013.01); *C04B 2235/5436* (2013.01); *C04B 2235/5445* (2013.01);
(Continued)

(58) Field of Classification Search
CPC .... C04B 2235/3205; C04B 2235/3206; C04B 2235/3208; C04B 2235/3224; C04B 2235/3225; C04B 2235/3232; C04B 2235/3244; C04B 2235/3248; C04B 2235/3249; C04B 2235/3878; C04B 2235/3895; C04B 2235/5436; C04B 2235/5445; C04B 2235/6562; C04B 2235/6565; C04B 2235/6567; C04B 2235/767; C04B 2235/77; C04B 2235/786; C04B 2235/80; C04B 2235/85; C04B 2235/96; C04B 2235/9607; C04B 2235/963; C04B 2237/125; C04B 2237/127; C04B 2237/368; C04B 2237/407; C04B 2237/704; C04B 2237/706; C04B 2237/86; C04B 35/584; C04B 37/026; H01L 23/12; H01L 23/13; H01L 23/15; H01L 23/36; H01L 23/3735; H05K 1/03; H05K 1/05
See application file for complete search history.

(56) References Cited

U.S. PATENT DOCUMENTS 5,744,410 A    4/1998   Komatsu et al.
6,316,116 B1 *   11/2001   Nakamura ............ C04B 41/009
                                                                           156/89.12
(Continued)

FOREIGN PATENT DOCUMENTS

EP          3061739 A1    8/2016
JP        H08-319165 A   12/1996
(Continued)

*Primary Examiner* — Lawrence D Ferguson
(74) *Attorney, Agent, or Firm* — Foley & Lardner LLP

(57) ABSTRACT

The present invention provides a high thermal conductive silicon nitride sintered body having a thermal conductivity of 50 W/m·K or more and a three-point bending strength of 600 MPa or more, wherein when an arbitrary cross section of the silicon nitride sintered body is subjected to XRD analysis and highest peak intensities detected at diffraction angles of 29.3±0.2°, 29.7±0.2°, 27.0±0.2°, and 36.1±0.2° are expressed as $I_{29.3°}$, $I_{29.7°}$, $I_{27.0°}$, and $I_{36.1°}$, a peak ratio $(I_{29.3°})/(I_{27.0°}+I_{36.1°})$ satisfies a range of 0.01 to 0.08, and a peak ratio $(I_{29.7°})/(I_{27.0°}+I_{36.1°})$ satisfies a range of 0.02 to 0.16. Due to above configuration, there can be provided a silicon nitride sintered body having a high thermal conductivity of 50 W/m·K or more, and excellence in insulating properties and strength.

24 Claims, 1 Drawing Sheet

(51) Int. Cl.
  *H01L 23/12* (2006.01)
  *H01L 23/13* (2006.01)
  *H01L 23/36* (2006.01)
  *H05K 1/03* (2006.01)
  *H05K 1/05* (2006.01)
  *H01L 23/15* (2006.01)
  *H01L 23/373* (2006.01)
  *C04B 37/02* (2006.01)

(52) U.S. Cl.
  CPC ........... *C04B 2235/6562* (2013.01); *C04B 2235/6565* (2013.01); *C04B 2235/6567* (2013.01); *C04B 2235/767* (2013.01); *C04B 2235/77* (2013.01); *C04B 2235/786* (2013.01); *C04B 2235/80* (2013.01); *C04B 2235/85* (2013.01); *C04B 2235/96* (2013.01); *C04B 2235/963* (2013.01); *C04B 2235/9607* (2013.01); *C04B 2237/125* (2013.01); *C04B 2237/127* (2013.01); *C04B 2237/368* (2013.01); *C04B 2237/407* (2013.01); *C04B 2237/704* (2013.01); *C04B 2237/706* (2013.01); *C04B 2237/86* (2013.01)

(56) References Cited

U.S. PATENT DOCUMENTS

| | | |
|---|---|---|
| 2002/0084103 A1 | 7/2002 | Komatsu et al. |
| 2006/0128552 A1 | 6/2006 | Komatsu |
| 2011/0176277 A1 | 7/2011 | Kaga et al. |

FOREIGN PATENT DOCUMENTS

| | | | |
|---|---|---|---|
| JP | 11-100273 A | | 4/1999 |
| JP | 2003309210 | * | 10/2003 |
| JP | 3797905 B2 | | 7/2006 |
| WO | WO-2005/113466 A1 | | 12/2005 |
| WO | WO-2010/002001 A1 | | 1/2010 |
| WO | WO-2014/092021 A1 | | 6/2014 |

* cited by examiner

HIGH THERMAL CONDUCTIVE SILICON NITRIDE SINTERED BODY, AND SILICON NITRIDE SUBSTRATE AND SILICON NITRIDE CIRCUIT BOARD AND SEMICONDUCTOR APPARATUS USING THE SAME

TECHNICAL FIELD

An embodiment relates to a high thermal conductive silicon nitride sintered body, and a silicon nitride substrate and a silicon nitride circuit board and a semiconductor apparatus using the same.

BACKGROUND ART

Silicon nitride sintered bodies are widely used for wear-resistant members such as bearing balls, making the most of their high structural strength. Conventional silicon nitride sintered bodies used for the wear-resistant members can provide a higher strength, a three-point bending strength of 900 MPa or more, while they have a low thermal conductivity of 20 W/m·K or less.

Examples of applications that have made the most of the high strength properties of silicon nitride sintered bodies in recent years include substrates for semiconductors. In Japanese Patent No. 3797905 (Patent Document 1), there is disclosed a silicon nitride substrate comprising a silicon nitride sintered body having a thermal conductivity of 50 W/m·K or more and a three-point bending strength of 500 MPa or more. In Patent Document 1, it is described that by setting the maximum pore diameter in the grain boundary phases at 0.3 μm or less, the current leakage value can be decreased to 1000 nA or less even if the thickness of the silicon nitride substrate is 0.3 to 1.5 mm.

A current leakage value represents the value of a current that flows between the front and back of a silicon nitride substrate when an alternating voltage under certain conditions is applied. As this current leakage value becomes smaller, higher insulating properties of the silicon nitride substrate are indicated. When the insulating properties of a silicon nitride substrate are low, conduction occurs between the front and the back of the silicon nitride substrate, thus resulting in the cause of the misoperation (mal-functioning) of a semiconductor apparatus.

Good heat dissipation (radiation) properties are required for a semiconductor substrate. Semiconductor devices include various ones such as Si semiconductors and SiC semiconductors. With higher output of semiconductor devices, the junction temperature increases from about 100° C. to about 200° C. Examples of measures for improving the heat dissipation properties of a semiconductor substrate include increasing the thermal conductivity of a silicon nitride sintered body and thinning a silicon nitride substrate. Particularly when a silicon nitride substrate can be thinned, smaller size and lighter weight of a semiconductor apparatus can also be actually achieved. At this time, with different materials such as ceramic and a metal electrode, strain stress occurs in the bonding portion because of the difference between their respective thermal expansion rates, and the like. Therefore, a certain level or more of material strength is required for a silicon nitride substrate, and the improvement of mechanical strength is also required.

PRIOR ART DOCUMENT

Patent Document 1: Japanese Patent No. 3797905

SUMMARY OF THE INVENTION

Problems to be Solved by the Invention

However, a problem of conventional silicon nitride substrates is that the insulating properties when the plate thickness is decreased to less than 0.30 mm cannot always be said to be sufficient.

The present invention has been made in order to solve such a problem, and it is an object of the present invention to provide a silicon nitride sintered body in which both mechanical strength and dielectric voltage properties are improved, thereby to provide a circuit board or the like in which excellent insulating properties can be ensured even if a thickness of a silicon nitride substrate is formed to be thin.

Means for Solving the Problems

A silicon nitride sintered body according to an embodiment is a high thermal conductive silicon nitride sintered body having a thermal conductivity of 50 W/m·K or more and a three-point bending strength of 600 MPa or more, wherein when an arbitrary cross section of the silicon nitride sintered body is subjected to XRD analysis and highest peak intensities detected at diffraction angles of 29.3±0.2°, 29.7±0.2°, 27.0±0.2°, and 36.1±0.2° are expressed as $I_{29.3°}$, $I_{29.7°}$, $I_{27.0°}$, and $I_{36.1°}$, a peak ratio $(I_{29.3°})/(I_{27.0°}+I_{36.1°})$ satisfies a range of 0.01 to 0.08, and a peak ratio $(I_{29.7°})/(I_{27.0°}+I_{36.1°})$ satisfies a range of 0.02 to 0.16.

Advantages of the Invention

The silicon nitride sintered body according to the embodiment satisfies the predetermined peak ratios when an arbitrary cross section is subjected to XRD analysis. Thus, the thermal conductivity and the strength can be improved. In addition, the dielectric voltage is also excellent. Therefore, even if a silicon nitride substrate is formed to be thin, excellent insulating properties can be maintained. Therefore, a silicon nitride circuit board using a silicon nitride substrate according to an embodiment has good insulating properties.

DESCRIPTION OF EMBODIMENTS

Figure 1:
FIG. 1 is a cross-sectional view showing one example of a silicon nitride substrate according to an embodiment.

A high thermal conductive silicon nitride sintered body according to an embodiment is a high thermal conductive silicon nitride sintered body having a thermal conductivity of 50 W/m·K or more and a three-point bending strength of 600 MPa or more, wherein when an arbitrary cross section of the silicon nitride sintered body is subjected to XRD analysis and the highest peak intensities detected at diffraction angles of 29.3±0.2°, 29.7±0.2°, 27.0±0.2°, and 36.1±0.2° are expressed as $I_{29.3°}$, $I_{29.7°}$, $I_{27.0°}$, and $I_{36.1°}$, the peak ratio $(I_{29.3°})/(I_{27.0°}+I_{36.1°})$ satisfies the range of 0.01 to 0.08, and the peak ratio $(I_{29.7°})/(I_{27.0°}+I_{36.1°})$ satisfies the range of 0.02 to 0.16.

The high thermal conductive silicon nitride sintered body has a thermal conductivity of 50 W/m·K or more, and a three-point bending strength of 600 MPa or more. When the thermal conductivity is less than 50 W/m·K, the thermal conductivity is low, and therefore the heat dissipation properties (heat radiating properties) are insufficient. When the three-point bending strength is less than 600 MPa, the structural strength of the sintered body is insufficient.

Next, when an arbitrary cross section of the silicon nitride sintered body is subjected to XRD analysis, peaks are detected at diffraction angles of 29.3±0.2°, 29.7±0.2°, 27.0±0.2°, and 36.1±0.2°. When their respective highest peaks are expressed as $I_{29.3°}$, $I_{29.7°}$, $I_{27.0°}$, and $I_{36.1°}$, the peak ratio $(I_{29.3°})/(I_{27.0°}+I_{36.1°})$ satisfies the range of 0.01 to 0.08, and the peak ratio $(I_{29.7°})/(I_{27.0°}+I_{36.1°})$ satisfies the range of 0.02 to 0.16.

Here, the XRD analysis conditions will be described. In the XRD analysis, an arbitrary cross section of the silicon nitride sintered body is set to a measurement surface. The measurement surface is a polished surface polished to have a surface roughness Ra of 0.05 µm or less. The XRD analysis is carried out with a tube voltage of 40 kV, a tube current of 40 mA, a scan speed of 2.0°/min, a slit (RS) of 0.15 mm, and a scan range (2 θ) of 10° to 50° using a Cu target (Cu—Kα).

The fact that peaks are detected by XRD analysis indicates that the silicon nitride sintered body comprises a predetermined crystalline compound.

$I_{29.3°}$ and $I_{29.7°}$ are peaks based on compound crystals present in the grain boundary phases. Further, $I_{27.0°}$ and $I_{36.1°}$ are peaks based on β type silicon nitride crystals. The grain boundary phases are compound phases mainly composed of sintering aid components as main components. The compound phases comprise, as main components, reaction phases such as those obtained by the reaction of the sintering aids, those obtained by the reaction of the sintering aids with each other, and those obtained by the reaction of the sintering aids with silicon nitride or impurity oxygen.

The peak heights increase as the abundance of the particular compound crystals increases. The fact that the peak ratio $(I_{29.3°})/(I_{27.0°}+I_{36.1°})$ satisfies the range of 0.01 to 0.08, and the peak ratio $(I_{29.7°})/(I_{27.0°}+I_{36.1°})$ satisfies the range of 0.02 to 0.16 means that a predetermined amount of the compound crystals are present.

The grain boundary phases are composed of compound crystal phases and amorphous phases (glass phases). For the sintering aids, metal oxides are mainly used. Therefore, the grain boundary phases mainly comprise metal oxides (including complex oxides). Generally, the compound crystal phases are hard compared with amorphous phases, and therefore the compound crystals are components that strengthen the grain boundary phases. By strengthening the grain boundary phases, the strength of the silicon nitride sintered body can be improved. In addition, a crystalline compound has higher thermal conductivity than amorphous phases. Therefore, by allowing the compound crystals to be present in the grain boundary phases, the thermal conductivity of the silicon nitride sintered body can be increased. By controlling the peak ratio $(I_{29.3°})/(I_{27.0°}+I_{36.1°})$ and the peak ratio $(I_{29.7°})/(I_{27.0°}+I_{36.1°})$ in the above-described ranges, high strength and high thermal conductivity can be simultaneously obtained.

In the silicon nitride sintered body according to the embodiment, even if an arbitrary cross section, that is, any cross section, is subjected to XRD analysis, the peak ratio $(I_{29.3°})/(I_{27.0°}+I_{36.1°})$ satisfies the range of 0.01 to 0.08, and the peak ratio $(I_{29.7°})/(I_{27.0°}+I_{36.1°})$ satisfies the range of 0.02 to 0.16. Therefore, the composition and abundance of the compound crystals present in the grain boundary phases are homogenized. When the composition and abundance of the compound crystals are homogenized, variations in dielectric voltage in the silicon nitride sintered body can be reduced.

As a result, even if this sintered body is applied to a thin silicon nitride substrate, excellent insulating properties can be ensured. When the above-described peak ratios are low, the amount of the compound crystals is small, and therefore high strength, high thermal conductivity, and the effect of improving dielectric voltage are not sufficiently obtained. In contrast, when the above-described peak ratios are excessively high, the amount of the compound crystals is too large. When the amount of the compound crystals is too large, the amount of the β type silicon nitride crystals decreases, and therefore the mechanical strength of the sintered body decreases.

The peak ratio $(I_{29.3°})/(I_{27.0°}+I_{36.1°})$ is more preferably in the range of 0.01 to 0.05. The peak ratio $(I_{29.7°})/(I_{27.0°}+I_{36.1°})$ is more preferably in the range of 0.02 to 0.13.

$I_{29.3°}$ and $I_{29.7°}$ are preferably peaks corresponding to rare earth element-hafnium-oxygen compound crystals. The rare earth element-hafnium-oxygen compound crystals preferably comprise two or more types of compound crystals having the same constituent elements and different composition ratios.

The rare earth element-hafnium-oxygen compound crystals are crystal phases having a rare earth element, hafnium (Hf), and oxygen (O) as constituent elements. The rare earth element is preferably at least one selected from Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

The rare earth element-hafnium-oxygen compound crystals can be composed of various compound crystals in which the valences of the rare earth element, hafnium, and oxygen are each different. Therefore, compound crystals for which peaks appear at $I_{29.3°}$ and $I_{29.7°}$ can be allowed to be present. Particularly yttrium (Y) can form compound crystals having different valences and is therefore preferred. Similarly, erbium (Er) can also form compound crystals having different valences and is therefore preferred. In the comparison of Y and Er, Y has a lower price and is therefore preferred.

Examples of yttrium-hafnium-oxygen compound crystals may include $Y_{1.6}Hf_{0.3}O_3$ crystals, $Y_{0.5}Hf_{0.5}O_{1.75}$ crystals, and $Y_{0.1}Hf_{0.9}O_{1.95}$ crystals. In the silicon nitride sintered body according to the embodiment, two or more types selected from $Y_{1.6}Hf_{0.3}O_3$ crystals, $Y_{0.5}Hf_{0.5}O_{1.75}$ crystals, and $Y_{0.1}Hf_{0.9}O_{1.95}$ crystals are preferably allowed to be present. Particularly two types, $Y_{1.6}Hf_{0.3}O_3$ crystals and $Y_{0.5}Hf_{0.5}O_{1.75}$ crystals, are preferably present. For the $Y_{1.6}Hf_{0.3}O_3$ crystals, the $I_{29.3°}$ peak can be obtained. For the $Y_{0.5}Hf_{0.5}O_{1.75}$ crystals, the $I_{29.7°}$ peak can be obtained.

Examples of erbium-hafnium-oxygen compound crystals may include $Er_{1.57}Hf_{0.32}O_3$ crystals, $Er_4Hf_3O_{12}$ crystals, and $Er_{0.67}Hf_{0.33}O_{1.67}$ crystals. For the $Er_{1.57}Hf_{0.32}O_3$ crystals, the $I_{29.3°}$ peak is obtained. For the $Er_4Hf_3O_{12}$ crystals or the $Er_{0.67}Hf_{0.33}O_{1.67}$ crystals, the $I_{29.7°}$ peak is obtained.

The qualitative analysis of the rare earth element-hafnium-oxygen compound crystals is carried out by TEM-EDX analysis. TEM is Transmission Electron Microscope. EDX is Energy Dispersive X-ray spectrometry. TEM-EDX analysis is an analysis method combining TEM with EDX.

As the composition of the rare earth element-hafnium-oxygen compound crystals, a composition configuration in which the atomic ratio of the rare earth element is high is preferred. Therefore, in Y—Hf—O compound crystals, it is preferred that the atomic ratio of Y is high. A rare earth element, particularly the Y element, is an element that promotes the columnar growth of silicon nitride, and contributes to higher strength of the sintered body. Having crystal phases in which the ratio of the rare earth element is high can achieve both grain growth by the homogeneous dispersion of the rare earth element in the grain boundaries, and fixation in the rare earth element-Hf—O compound crystal phases (the strengthening of the grain boundary phases). As a result, defects in the grain boundary phases decrease, leading to the improvement of strength and insulating properties. Similarly, also in the case of Er—Hf—O compound crystals, it is preferred that the atomic ratio of Er is high.

An element having a large atomic radius such as a rare earth element easily causes diffusion control for diffusion into grain boundaries. In other words, a rare earth element having a large atomic radius has a slow diffusion rate, and therefore nonuniform grain boundary phases are easily formed. In contrast to this, by adding an appropriate amount of Hf, diffusion can be promoted. By promoting diffusion, the promotion of densification accompanying the formation of columnar silicon nitride can be intended. In addition, uniform grain boundary phases in which rare earth element-Hf—O compound crystal phases are dispersed can be obtained. As a result, even when a thin substrate is made, achieving both strength and insulating properties can be intended.

By allowing yttrium-hafnium-oxygen compound crystals to be present, excellent characteristics can be exhibited even when a rare earth element other than yttrium is not added. For example, in Patent Document 1, one in which $Y_2O_3$ and $Er_2O_3$ are used in combination is disclosed. In the embodiment, excellent characteristics are obtained even if the rare earth element is only $Y_2O_3$, and therefore a cost reduction effect is also obtained.

The sum of the peak ratio $(I_{29.3°})/(I_{27.0°}+I_{36.1°})$ and the peak ratio $(I_{29.7°})/(I_{27.0°}+I_{36.1°})$ preferably satisfies the range of 0.03 to 0.20. As described above, the peak ratios are determined by the abundance of the particular compound crystals. By setting the sum of the peak ratio $(I_{29.3°})/(I_{27.0°}+I_{36.1°})$ and the peak ratio $(I_{29.7°})/(I_{27.0°}+I_{36.1°})$ within the range of 0.03 to 0.20, the amount of the compound crystals is made appropriate, and the thermal conductivity, strength, and dielectric voltage characteristics are improved. The sum of the peak ratio $(I_{29.3°})/(I_{27.0°}+I_{36.1°})$ and the peak ratio $(I_{29.7°})/(I_{27.0°}+I_{36.1°})$ is more preferably in the range of 0.03 to 0.15.

When the highest peak intensity detected at a diffraction angle of 34.8±0.2° is expressed as $I_{34.8°}$, the peak ratio $(I_{34.8°})/(I_{27.0°}+I_{36.1°})$ is preferably 0.02 or less (including zero). $I_{34.8°}$ is a peak detected when $Y_{0.1}Hf_{0.9}O_{1.95}$ crystals are present. When the abundance of $Y_{0.1}Hf_{0.9}O_{1.95}$ crystals increases, the abundance of $Y_{1.6}Hf_{0.5}O_5$ crystals or $Y_{0.5}Hf_{0.5}O_{1.75}$ crystals may decrease. As a result, the peak ratio $(I_{29.3°})/(I_{27.0°}+I_{36.1°})$ and the peak ratio $(I_{29.7°})/(I_{27.0°}+I_{36.1°})$ may decrease.

The rare earth element-hafnium-oxygen compound crystals are preferably ternary systems of a rare earth element, hafnium, and oxygen but may comprise other elements as constituent elements. Examples of the other elements may include sintering aid components other than rare earth elements or hafnium. As such sintering aid components, a Mg component and a Ca component are preferred. Nitrogen (N) may be contained as a constituent element of the rare earth element-hafnium-oxygen compound crystals.

It is preferred that the content of the rare earth element in the silicon nitride sintered body is 3 to 10% by mass, further 5 to 9% by mass, in terms of an oxide. The oxide conversion is performed with $R_2O_3$, wherein the rare earth element is R.

It is preferred that the content of Hf is 0.5 to 5% by mass, further 1 to 3% by mass, in terms of an oxide. The oxide conversion is performed with $HfO_2$.

The total value of the content of the rare earth element (in terms of an oxide) and the content of Hf (in terms of an oxide) is preferably 6% by mass or more.

The mass ratio [the content of the rare earth element (in terms of an oxide)/the content of Hf (in terms of an oxide)] is preferably 2 or more and 6 or less. When the total amount of the rare earth element and Hf the mass ratio therebetween are adjusted, the compound crystal phases having the predetermined XRD peaks are easily formed. This leads to the promotion of densification accompanying the formation of columnar silicon nitride and to the formation of uniform grain boundary phases in which rare earth element-Hf—O compound crystal phases are dispersed described above.

The silicon nitride sintered body according to the embodiment may contain 5% by mass or less (including zero) of an element other than rare earth elements and Hf. Examples of the component contained may include one or two or more selected from Mg (magnesium), Ca (calcium), Ti (titanium), Zr (zirconium), and Al (aluminum). The Mg content is preferably 0.1 to 4% by mass in terms of an oxide. The oxide conversion is performed with MgO. The Ca content is preferably 0.1 to 4% by mass in terms of an oxide. The oxide conversion is performed with CaO. The Ti content is preferably 0.1 to 3% by mass in terms of an oxide. The oxide conversion is performed with $TiO_2$. The Zr content is preferably 0.1 to 3% by mass in terms of an oxide. The oxide conversion is performed with $ZrO_2$. The Al content is preferably 0.1 to 3% by mass in terms of an oxide. The oxide conversion is performed with $Al_2O_3$.

The sintering aid components such as the rare earth element and Hf are preferably added as components comprising oxygen as a constituent element. Examples of the components comprising oxygen as a constituent element may include oxides or carbonates. The total amount of oxygen in the total amount of the sintering aid components is preferably 0.5 to 5% by mass. For example, the total amount of oxygen when $Y_2O_3$ is 3% by mass, $HfO_2$ is 1% by mass, and the remainder is silicon nitride is obtained as follows: The molecular weight of $Y_2O_3$ is 225.8 (=88.9×2+16×3), and the molecular weight of $HfO_2$ is 210.5 (=178.5+16×2). The oxygen ratio in $Y_2O_3$ is 0.21 (=48/225.8), and the oxygen ratio in $HfO_2$ is 0.15 (=32/210.5). The oxygen content when $Y_2O_3$ is 3% by mass is 0.63 (=3×0.21) % by mass. The oxygen content when $HfO_2$ is 1% by mass is 0.15 (=1×0.15) % by mass. The total amount of oxygen in the total amount of the sintering aid components is obtained as 0.78 (=0.63+0.15) % by mass.

When the total amount of oxygen in the total amount of the sintering aid components is less than 0.5% by mass, the amount of oxygen is small, and therefore the abundance of the rare earth element-hafnium-oxygen compound crystals may decrease. When the total amount of oxygen is more than 5% by mass and an excessive amount, the amount of the grain boundary phases is too large, and therefore the strength and the thermal conductivity may decrease.

In the silicon nitride sintered body according to the embodiment, the compound crystals are allowed to be present in the grain boundary phases so that the XRD peak ratios as described above appear. Thus, the silicon nitride sintered body having a thermal conductivity of 50 W/m·K or more and a three-point bending strength of 600 MPa or more can be obtained. The dielectric voltage can be 10 kV/mm or more.

The silicon nitride sintered body according to the embodiment is effective as the constituent material of a silicon nitride substrate. The silicon nitride substrate preferably has a substrate thickness of 0.10 mm or more and 0.70 mm or less. Even if the substrate thickness is 0.70 mm or less, the silicon nitride sintered body having a thermal conductivity of 50 W/m·K or more and a three-point bending strength of 600 MPa or more can be obtained. The dielectric voltage can be 10 kV/mm or more.

The maximum diameter of the grain boundary phases is preferably 10 μm or less in an arbitrary cross section of the silicon nitride sintered body. The average particle diameter of major axes of the silicon nitride crystal particles is preferably 1 to 10 μm. The maximum diameter of the major axes of the silicon nitride crystal particles in the silicon nitride sintered body is preferably 20% or less of the substrate thickness. The porosity of the silicon nitride sintered body is preferably 3% or less.

The maximum diameter of the pores is preferably 1 μm or less. By controlling the maximum diameter of the grain boundary phases, the average particle diameter of the major axes of the silicon nitride crystal particles, porosity, and the maximum diameter of the pores, the abundance of the compound crystals in the grain boundary phases can be further homogenized.

Therefore, even if the substrate thickness is decreased to 0.70 mm or less, further less than 0.30 mm, the thermal conductivity, strength, and dielectric voltage can be improved. From the viewpoint of maintaining strength, the substrate thickness is preferably 0.10 mm or more. Therefore, a silicon nitride substrate according to an embodiment preferably has a substrate thickness of 0.10 mm or more and 0.70 mm or less, further 0.10 mm or more and less than 0.30 mm.

The maximum diameter of the grain boundary phases, the average particle diameter of the major axes of the silicon nitride crystal particles, the proportion of the maximum diameter of the major axes of the silicon nitride crystal particles to the substrate thickness, and the maximum diameter of the pores are measured by the following procedure: an enlarged photograph (3000 times) of a unit area of 100 μm×100 μm is taken in an arbitrary cross section of the silicon nitride sintered body by an SEM (Scanning Electron Microscope). When a unit area of 100 μm×100 μm cannot be photographed in one field of view, photographing may be conducted in a plurality of fields of view.

The longest diagonal lines of silicon nitride crystal particles, grain boundary phases, and pores shown in the enlarged photograph are taken as the major axes of the silicon nitride crystal particles, the major axes of the grain boundary phases, and the major axes of the pores. This operation is carried out for two enlarged photographs (unit area 100 μm×100 μm), and the largest major axes are taken as the maximum diameter of the major axes of the silicon nitride crystal particles, the maximum diameter of the grain boundary phases, and the maximum diameter of the pores. The porosity is measured by the Archimedean method.

Figure 3:
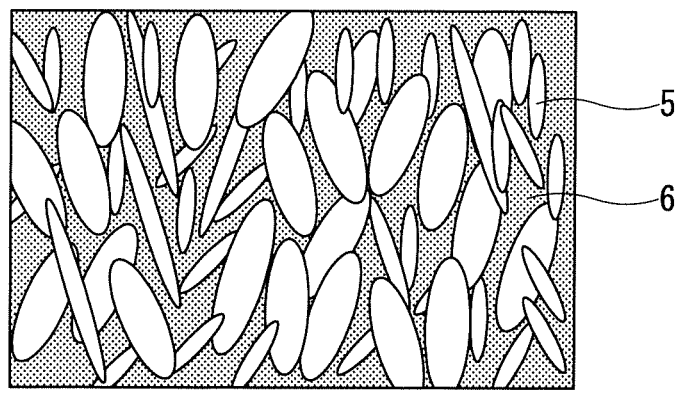
FIG. 3 is a texture diagram showing one example of the sintered texture of a silicon nitride sintered body according to an embodiment.

One example of the texture of the silicon nitride sintered body according to the embodiment is shown in FIG. 3. In the figure, a reference numeral 5 denotes a silicon nitride crystal particle, and a reference numeral 6 denotes a grain boundary phase.

The silicon nitride sintered body according to the embodiment mainly comprises β type silicon nitride crystal particles. The β type silicon nitride crystal particles have an elongated shape having an aspect ratio of 2 or more. The silicon nitride sintered body according to the embodiment has a structure in which the elongated silicon nitride crystal particles are randomly entangled, and the gaps between the silicon nitride crystal particles are filled with grain boundary phases. In the silicon nitride sintered body according to the embodiment, the compound crystals having the predetermined XRD peaks are allowed to be present in the grain boundary phases so as to obtain the predetermined peak ratios. The size of the grain boundary phases can be controlled by the amount of the silicon nitride crystal particles, silicon nitride crystal particle size, the amounts of the sintering aids, porosity, and pore size. By controlling the maximum diameter of the grain boundary phases, the average particle diameter of the major axes of the silicon nitride crystal particles, porosity, and the maximum diameter of the pores, the abundance of the compound crystals can be made more homogeneous. Thus, even when the substrate thickness is decreased to be 0.70 mm or less, further less than 0.30 mm, the dielectric voltage can be 10 kV/mm or more, further 20 kV/mm or more.

It is preferred that the maximum diameter of the grain boundary phases is 10 μm or less, further 6 μm or less. It is also preferred that the porosity is 3% or less, further 0.5% or less (including zero). It is also preferred that the maximum diameter of the pores is 1 μm or less, further 0.3 μm or less (including zero). By making the grain boundary phases small and making the pores small, the insulating properties can be further improved.

The frequency dependence of the relative dielectric constant can be reduced. $(\varepsilon r_{50}-\varepsilon r_{1000})/\varepsilon r_{50} \leq 0.1$ can be obtained, wherein the relative dielectric constant at 50 Hz is $\varepsilon r_{50}$, and the relative dielectric constant at 1 kHz is $\varepsilon r_{1000}$.

The relative dielectric constant represents a value obtained by dividing the capacitance of a capacitor when the space between the electrodes is filled with a medium by the capacitance when the space between the electrodes is vacuum. This medium is the silicon nitride sintered body. The relation formula: $(\varepsilon r_{50}-\varepsilon r_{1000})/\varepsilon r_{50} \leq 0.1$ indicates that the relative dielectric constant of the silicon nitride sintered body does not increase even if the frequency increases. This indicates that the polarization of the silicon nitride sintered body does not occur easily. By forming the grain boundary phases for which the predetermined XRD peaks as described above are detected, the frequency dependence of the relative dielectric constant can be reduced.

A semiconductor device (element, chip) has high operating frequency in order to perform a high speed operation. By reducing the frequency dependence of the relative dielectric constant of the silicon nitride sintered body, the polarization of the silicon nitride sintered body does not occur easily even if a semiconductor device having high operating frequency is mounted. By suppressing the polarization, high insulating properties can be maintained. In the silicon nitride sintered body according to the embodiment, $(\varepsilon r_{50}-\varepsilon r_{1000})/\varepsilon r_{50}$ can be lowered to be 0.1 or less, further 0.020 or less.

Figure 2:
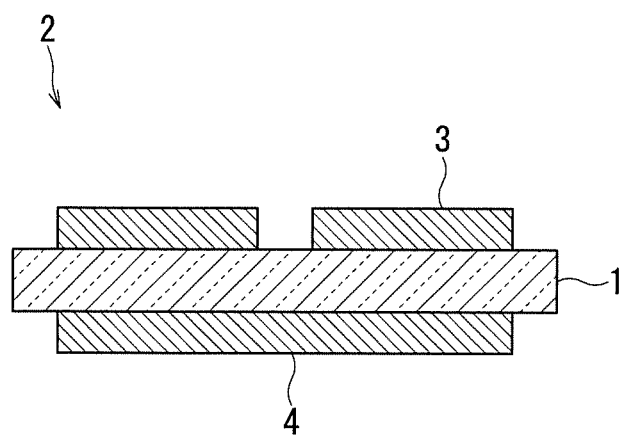
FIG. 2 is a cross-sectional view showing one example of a silicon nitride circuit board according to an embodiment.

The silicon nitride sintered body as described above is effective as the constituent material of a silicon nitride substrate. A silicon nitride substrate is illustrated in FIG. 1, and a silicon nitride circuit board is illustrated in FIG. 2. In the figures, a reference numeral 1 denotes a silicon nitride substrate, numeral 2 denotes a silicon nitride circuit board, numeral 3 denotes a front metal plate, and numeral 4 denotes a back metal plate.

Examples of the front metal plate 3 and the back metal plate 4 include metal materials having high electrical conductivity such as copper plates and aluminum plates. Although the thickness of each of the front metal plate 3 and the back metal plate 4 is arbitrary, a thickness of 0.2 mm or more is preferred.

The metal plates are preferably bonded by an active metal bonding method using an active metal brazing material such as Ag—Cu—Ti. The front metal plate 3 or the back metal plate 4 is not limited to a metal plate and may be a metallized film formed by heating a metal paste, a metal thin film obtained by using a thin film formation technique such as a plating method, a sputtering method, or a thermal spraying method, or the like. The silicon nitride substrate 1 may be used as a silicon nitride substrate for a pressure-welded structure (a pressure-contacting structure) without metal plates being bonded.

A plurality of metal plates may be bonded to at least one surface of the silicon nitride circuit board 2. The thickness of at least one metal plate may be 0.70 mm or more. The silicon nitride substrate 1 according to an embodiment is excellent in thermal conductivity, strength and dielectric voltage, and is therefore excellent in insulating properties and durability even if the metal plate is thickened. The thickness of the metal plate contributes to electrical conduction and heat dissipation (radiating) properties, and therefore it is preferred that the thickness is 0.20 mm or more, further 0.70 mm or more. Particularly, when a semiconductor device (chip) having a large amount of heat generation is mounted, a thicker metal plate is preferred because the heat dissipation properties increase. When a structure in which a plurality of metal plates are disposed on one surface is made, a structure in which a semiconductor chip is mounted on each metal plate can be made. A silicon nitride circuit board according to an embodiment exhibits excellent insulating properties and durability even if a plurality of semiconductor chips are mounted. For example, the junction temperature of a SiC chip increases to about 200° C.

The heat dissipation properties, strength, and insulating properties of the silicon nitride substrate and the silicon nitride circuit board are improved, and therefore the heat-resistant cycle characteristics (TCT (thermal cycle test) characteristics) are excellent. In this connection, when a TCT is performed with one cycle of −50° C.×30 minutes→room temperature×10 minutes→200° C.×30 minutes→room temperature×10 minutes, no cracks occur in the silicon nitride substrate even after 5000 cycles even if the silicon nitride substrate has a thickness of 0.70 mm or less, further less than 0.30 mm. In addition, the decrease rate of dielectric voltage can also be 20% or less.

Therefore, the silicon nitride circuit board according to the embodiment is preferred for mounting a semiconductor chip having a junction temperature of 100° C. or more, further 150° C. or more. In other words, the silicon nitride circuit board according to the embodiment is preferred for a semiconductor apparatus in which a semiconductor chip having a junction temperature of 100° C. or more, further 150° C. or more, is mounted. Moreover, excellent characteristics are exhibited even if a plurality of semiconductor chips are mounted.

The upper limit of the thickness of the metal plate is not particularly limited but is preferably 5 mm or less. When the thickness of the metal plate is more than 5 mm, the warpage of the silicon nitride circuit board is likely to increase when the silicon nitride substrate is thinned.

Next, a method for manufacturing the silicon nitride substrate according to the embodiment will be described. As long as the silicon nitride substrate according to the embodiment has the above configuration, the method for manufacturing the silicon nitride substrate is not particularly limited. Examples of manufacturing methods for efficiently obtaining the silicon nitride substrate include the following:

First, raw material powders are prepared. The raw material powders comprise a silicon nitride powder, a rare earth compound powder, and hafnium compound powder as essential components. Examples of the rare earth compound may include rare earth oxides.

Examples of the hafnium compound include hafnium oxide. By adding the oxides, rare earth element-hafnium-oxygen compound crystals are easily formed.

The silicon nitride powder preferably has an α conversion rate of 80% by mass or more, an average particle diameter of 0.4 to 2.5 μm, and an impurity oxygen content of 2% by mass or less. It is preferred that the impurity oxygen content is 2% by mass or less, further 1.0% by mass or less, and further 0.1 to 0.8% by mass. When the impurity oxygen content is more than 2% by mass and high, the reaction of impurity oxygen and the sintering aids occurs, and grain boundary phases may be formed more than necessary.

The silicon nitride powder may be one having a thin oxide film formed on its surface. The surface oxide film comprises silicon oxide as the main component. Silicon oxide has the effect of making the reaction of the silicon nitride powder surface and the sintering aids uniform. Therefore, oxide liquid phases (grain boundary phases) on silicon nitride crystal particle surfaces are easily homogeneously formed.

It is preferred that the amount of the rare earth compound powder added is 3 to 10% by mass, further 5 to 9% by mass, in terms of an oxide. The oxide conversion is performed with $R_2O_3$, wherein the rare earth element is R.

It is preferred that the amount of the hafnium compound added is 0.5 to 5% by mass, further 1 to 3% by mass, in terms of an oxide. The oxide conversion is performed with $HfO_2$.

The total value of the amount of the rare earth compound added (in terms of an oxide) and the amount of the Hf compound added (in terms of an oxide) is preferably 6% by mass or more. The mass ratio [the amount of the rare earth compound added (in terms of an oxide)/the amount of the Hf compound added (in terms of an oxide)] is preferably 2 or more and 6 or less. When the total amount of the rare earth compound and the Hf compound added and the mass ratio of the rare earth compound to the Hf compound are adjusted, the compound crystal phases having the predetermined XRD peaks are easily formed. This leads to the promotion of densification accompanying the formation of columnar silicon nitride and to the formation of uniform grain boundary phases in which rare earth element-Hf—O compound crystal phases are dispersed.

One or two or more selected from a Mg (magnesium) compound powder, a Ca (calcium) compound powder, a Ti (titanium) compound powder, a Zr (zirconium) compound powder, and an Al (aluminum) compound powder are added as necessary. The amount of these compounds added is preferably 5% by mass or less in total. These compounds are preferably oxides or carbonates. When oxygen is contained as a constituent element of the sintering aids, oxide liquid phases are formed by the reaction of the sintering aids with each other or the reaction of impurity oxygen in the silicon nitride powder and the sintering aids, and the formation of columnar silicon nitride crystal particles can be promoted.

These sintering aids are preferably fine powders, and particularly by setting the average particle diameters at 0.5 μm or less, inhomogeneous liquid phase production can be suppressed. This is because as the powders become finer, the reactivity increases, and the reaction variations with respect to temperature decrease, and the composition during formulation is easily reflected. This homogeneous liquid phase production is effective for the control of the particular crystal phase peaks, leading to the improvement of the characteristics of the sintered body.

The above raw material powders are mixed, and an organic binder is further added to prepare a raw material mixture. At this time, amorphous carbon, a plasticizer, and the like may be added as necessary.

Oxygen as an impurity is present on the surface of the silicon nitride raw material powder. However, excessive oxygen may cause grain boundary defects.

Here, the amorphous carbon functions as a deoxidizer. By setting the carbon content (the amount of remaining carbon) before sintering treatment at 0.1 to 0.2 wt %, the amorphous carbon reacts with oxygen and is released to the outside as $CO_2$ and CO and is therefore useful for removing excessive oxygen (oxygen that does not contribute to the liquid phase reaction). When the carbon content before sintering treatment is 0.1 wt % or less, the deoxidation effect is small. When the carbon content before sintering treatment is more than 0.2 wt % and high, the amorphous carbon remains in the sintered body easily and may cause structure defects.

Next, the molding step of molding the raw material mixture is carried out. As the raw material mixture molding method, a general-purpose die pressing method, cold isostatic pressing (CIP) method, or sheet forming method such as doctor blade method or roll forming method, or the like can be applied. The raw material mixture is mixed with a solvent such as toluene, ethanol, or butanol, as necessary.

Next, after the above molding step, a molded body degreasing step is carried out. In the degreasing step, the molded body is heated in a non-oxidizing atmosphere at a temperature of 500 to 800° C. for 1 to 4 hours to degrease most of the previously added organic binder. Examples of the non-oxidizing atmosphere include a nitrogen gas atmosphere and an argon gas atmosphere.

Examples of the organic binder may include butyl methacrylate, polyvinyl butyral, and polymethyl methacrylate. When the raw material mixture (the total amount of the silicon nitride powder and the sintering aid powders) is 100 parts by mass, the amount of the organic binder added is preferably 3 to 17 parts by mass.

When the amount of the organic binder added is less than 3 parts by mass, the amount of the binder is too small, and it is difficult to maintain the shape of the molded body. In such a case, the improvement of mass productivity by multi-layering is difficult.

On the other hand, when the amount of the binder is more than 17 parts by mass and too large, the molded body after degreasing step (the degreased molded body) has larger voids, and pores in the silicon nitride substrate become large.

Next, the degreased molded body is housed in a firing container and subjected to a sintering step in a non-oxidizing atmosphere in a firing furnace. The sintering step is preferably carried out at a temperature in the range of 1800 to 1950° C. As the non-oxidizing atmosphere, a nitrogen gas atmosphere or a reducing atmosphere comprising nitrogen gas is preferred. Regarding the pressure in the firing furnace, a pressurized atmosphere is preferred.

When firing is performed in a low temperature state in which the sintering temperature is less than 1800° C., the grain growth of the silicon nitride crystal particles is not sufficient, and a dense sintered body is not easily obtained. On the other hand, when firing is performed at a sintering temperature higher than 1950° C., decomposition into Si and $N_2$ may occur when the atmosphere pressure in the furnace is low, and therefore the sintering temperature is preferably controlled in the above range. The sintering time is preferably within the range of 7 to 20 hours.

When the sintering step is carried out, the temperature increase rate from 1350° C. to the sintering temperature is preferably adjusted at 50° C./h or less. Particularly controlling the temperature increase rate in the range of 1400° C. or more and 1600° C. or less is effective. This temperature range is a temperature region in which 70% or more of the β transition of an α type silicon nitride powder proceeds. The α type silicon nitride powder undergoes phase transition to a β type silicon nitride powder from around 1400° C. When the phase transition to the β phase occurs, the silicon nitride forms columnar crystal particles. By increasing the temperature at a slow rate, a temperature increase rate of 50° C./h or less, the formation of columnar silicon nitride crystal particles can be uniformly carried out. In addition, the reaction of the rare earth compound and the hafnium compound can also be made uniform. Therefore, the dispersed state of the rare earth element-Hf—O crystalline compound can also be made uniform. Such control of the temperature increase rate is effective for a thin substrate having a thickness of 0.70 mm or less, further less than 0.30 mm.

Examples of the non-oxidizing atmosphere may include nitrogen gas ($N_2$) and argon gas (Ar). Laminating the molded bodies in multiple stages to improve mass productivity is also effective. By sintering the molded bodies in a state of being laminated in multiple stages, the temperature in the furnace becomes uniform, and the reaction can be made uniform.

The cooling rate of the sintered body after the sintering step is preferably 100° C./h or less. A gradual change in the cooling rate of 100° C./h or less, further 50° C./h or less enables the grain boundary phases to be crystallized. The proportion of the crystalline compound in the grain boundary phases can be increased.

The silicon nitride sintered body and the silicon nitride substrate according to the embodiments can be made by the above steps. In addition, a silicon nitride circuit board can be made by bonding a metal plate.

EXAMPLES

Examples 1 to 11 and Comparative Examples 1 and 2

As a raw material powder, an α type silicon nitride powder having an average particle diameter of 1.2 μm and an amount of impurity oxygen of 1.0 wt % was prepared. Next, sintering aid powders shown in Table 1 were added, and mixed in a ball mill for 48 hours to prepare a mixed raw material powder. For the average particle diameters of the sintering aid powders, in Examples 2 to 11, the sintering aid powders were mixed after being adjusted at an average particle diameter of 0.2 to 0.5 μm, and in Example 1 and Comparative Examples 1 and 2, sintering aid powders having an average particle diameter of 1 to 2 μm were mixed. The amounts of the sintering aid powders added are shown based on 100% by mass of the total of the sintering aid powders and the silicon nitride powder. In Example 6, a silicon nitride powder having a thin oxide film provided on its surface was used.

TABLE 1

| Sample No. | Amounts of Sintering Aids (Mass %) | Total Amount of Oxygen in Sintering Aid Component (Mass %) |
|---|---|---|
| Example 1 | $Y_2O_3$ (9 wt %), $HfO_2$ (3 wt %) | 2.83 |
| Example 2 | $Y_2O_3$ (5 wt %), $HfO_2$ (1.5 wt %), MgO (2 wt %), CaO (1 wt %) | 2.90 |
| Example 3 | $Y_2O_3$ (5 wt %), $HfO_2$ (2 wt %), MgO (1 wt %), $CaCO_3$ (2 wt %), $TiO_2$ (0.5 wt %) | 3.37 |
| Example 4 | $Y_2O_3$ (6 wt %), $HfO_2$ (1 wt %), MgO (1 wt %), CaO (1 wt %), $TiO_2$ (1 wt %) | 3.01 |
| Example 5 | $Y_2O_3$ (9 wt %), $HfO_2$ (2 wt %), MgO (0.5 wt %), $CaCO_3$ (0.5 wt %), $TiO_2$ (0.1 wt %) | 3.12 |
| Example 6 | $Y_2O_3$ (9 wt %), $HfO_2$ (2 wt %), MgO (0.8 wt %), $CaCO_3$ (0.4 wt %), $TiO_2$ (0.1 wt %) | 3.18 |
| Example 7 | $Y_2O_3$ (10 wt %), $HfO_2$ (2.5 wt %), MgO (2 wt %), CaO (1 wt %) | 3.80 |
| Example 8 | $Er_2O_3$ (10 wt %), $HfO_2$ (1 wt %), MgO (2 wt %), CaO (1 wt %) | 2.89 |
| Example 9 | $Y_2O_3$ (10 wt %), $HfO_2$ (2 wt %), MgO (1 wt %) | 3.21 |
| Example 10 | $Y_2O_3$ (10 wt %), $HfO_2$ (4 wt %), MgO (2 wt %), CaO (1 wt %) | 3.94 |
| Example 11 | $Y_2O_3$ (5 wt %), $HfO_2$ (1.5 wt %), MgO (2 wt %), CaO (1 wt %) | 2.90 |
| Comparative Example 1 | $Y_2O_3$ (3 wt %), $HfO_2$ (2 wt %) | 1.66 |
| Comparative Example 2 | $Y_2O_3$ (4 wt %), $Er_2O_3$ (4 wt %), MgO (1 wt %), $HfO_2$ (1 wt %), $TiO_2$ (1 wt %) | 2.79 |

Each mixed raw material powder was mixed with a resin binder to prepare a mixed raw material paste. Each mixed raw material paste was sheet-molded by a doctor blade method. The sheet-molded body was cut so that a target substrate size was obtained, subjected to a degreasing step, and subjected to a temperature increasing step and a sintering step shown in Table 2. In all of the Examples and the Comparative Examples, the amount of remaining carbon after the degreasing was set to within the range of 0.1 to 0.2 wt %. The temperature increasing step and the sintering step were carried out in a nitrogen atmosphere.

TABLE 2

| Sample No. | Temperature Increase Step | | Sintering Step | | Substrate Size |
| | Temperature Range | Temperature Increase Rate | Temp. × Time | Cooling Rate | (Length × Width × Thickness) (mm) |
|---|---|---|---|---|---|
| Example 1 | 1400~1700° C. | 50° C./h | 1850° C. × 10 h | 80° C./h | 50 × 30 × 0.632 |
| Example 2 | 1400~1600° C. | 50° C./h | 1830° C. × 15 h | 50° C./h | 50 × 30 × 0.32 |
| Example 3 | 1400~1600° C. | 25° C./h | 1820° C. × 13 h | 30° C./h | 50 × 30 × 0.28 |
| Example 4 | 1400~1600° C. | 25° C./h | 1800° C. × 12 h | 30° C./h | 50 × 30 × 0.25 |
| Example 5 | 1400~1600° C. | 25° C./h | 1800° C. × 18 h | 30° C./h | 50 × 30 × 0.32 |
| Example 6 | 1400~1600° C. | 25° C./h | 1780° C. × 15 h | 30° C./h | 50 × 30 × 0.20 |
| Example 7 | 1400~1600° C. | 50° C./h | 1830° C. × 15 h | 50° C./h | 50 × 30 × 0.32 |
| Example 8 | 1400~1600° C. | 25° C./h | 1800° C. × 12 h | 30° C./h | 50 × 30 × 0.25 |
| Example 9 | 1400~1600° C. | 25° C./h | 1820° C. × 12 h | 20° C./h | 50 × 30 × 0.32 |
| Example 10 | 1400~1600° C. | 25° C./h | 1820° C. × 12 h | 30° C./h | 50 × 30 × 0.32 |
| Example 11 | 1400~1600° C. | 50° C./h | 1800° C. × 15 h | 50° C./h | 50 × 30 × 0.32 |
| Comparative Example 1 | 1400~1700° C. | 100° C./h | 1850° C. × 18 h | 100° C./h | 50 × 30 × 0.25 |
| Comparative Example 2 | 1400~1600° C. | 200° C./h | 1850° C. × 18 h | 100° C./h | 50 × 30 × 0.32 |

The silicon nitride substrates according to the Examples and the Comparative Examples were subjected to XRD analysis and their thermal conductivities and three-point bending strengths were measured.

In the XRD analysis, at first, a polished surface obtained by polishing an arbitrary cross section to a surface roughness Ra of 0.05 µm or less was provided. The XRD analysis was carried out with a tube voltage of 40 kV, a tube current of 40 mA, a scan speed of 2.0°/min, a slit (RS) of 0.15 mm, and a scan range (2 θ) of 10° to 50° using a Cu target (Cu—Kα).

The thermal conductivity was measured by a laser flash method. The three-point bending strength was measured in accordance with JIS-R1601. The results are shown in the following Table 3.

TABLE 3

| | Peak Ratios in XRD Analysis | | | Thermal Conductivity (W/m · K) | Tree-Point Bending Strength (MPa) |
|---|---|---|---|---|---|
| Sample No. | $(I_{29.3°})/(I_{27.0°}+I_{36.1°})$ | $(I_{29.7°})/(I_{27.0°}+I_{36.1°})$ | $(I_{34.8°})/(I_{27.0°}+I_{36.1°})$ | | |
| Example 1 | 0.02 | 0.09 | 0.005 | 60 | 610 |
| Example 2 | 0.02 | 0.05 | 0 | 82 | 650 |
| Example 3 | 0.01 | 0.05 | 0.01 | 75 | 650 |
| Example 4 | 0.04 | 0.05 | 0 | 89 | 680 |
| Example 5 | 0.03 | 0.11 | 0 | 83 | 720 |
| Example 6 | 0.03 | 0.10 | 0 | 80 | 740 |
| Example 7 | 0.07 | 0.13 | 0 | 80 | 680 |
| Example 8 | 0.02 | 0.04 | 0 | 87 | 630 |
| Example 9 | 0.01 | 0.16 | 0 | 90 | 700 |
| Example 10 | 0.06 | 0.16 | 0.01 | 73 | 600 |
| Example 11 | 0.01 | 0.04 | 0 | 88 | 630 |
| Comparative Example 1 | 0 | 0.02 | 0.01 | 53 | 550 |
| Comparative Example 2 | 0 | 0.04 | 0 | 75 | 570 |

For the silicon nitride substrates according to the Examples and the Comparative Examples described above, the $I_{27.0°}$ and $I_{36.1°}$ peaks corresponding to β-$Si_3N_4$ crystals were detected. In the Examples, the peak ratio $(I_{29.3°})/(I_{27.0°}+I_{36.1°})$ was within the range of 0.01 to 0.05, and the peak ratio $(I_{29.7°})/(I_{27.0°}+I_{36.1°})$ was within the range of 0.02 to 0.13. The sum of the peak ratio $(I_{29.3°})/(I_{27.0°}+I_{36.1°})$ and the peak ratio $(I_{29.7°})/(I_{27.0°}+I_{36.1°})$ was within the range of 0.03 to 0.15. In addition, there are columns showing zero for peak ratios, and each of them indicates that peaks for each peak ratio were equal to or less than the detection limit.

In contrast to this, in Comparative Examples 1 and 2, the thermal conductivity and the three-point bending strength were excellent. On the other hand, either one (or both) of the peak ratio $(I_{29.3°})/(I_{27.0°}+I_{36.1°})$ or the peak ratio $(I_{29.7°})/(I_{27.0°}+I_{36.1°})$ was outside the range.

Next, the composition of compound crystals, porosity, the maximum diameter of pores, the average particle diameter of the major axes of silicon nitride crystal particles, and the maximum diameter of the major axes of silicon nitride crystal particles of the silicon nitride substrates according to the Examples and the Comparative Examples were examined. The composition analysis of compound crystals was carried out by TEM-EDX.

The porosity was measured by the Archimedes method. The maximum diameter of pores, the average particle diameter of the major axes of silicon nitride crystal particles, and the maximum diameter of the major axes of silicon nitride crystal particles were measured by observing a cross section in the thickness direction by means of an SEM. In the SEM observation, an enlarged photograph (3000×) of a unit area of 100 µm×100 µm is taken. The largest diagonal line of pores in the enlarged photograph was taken as the maximum diameter. Similarly, the longest diagonal lines of silicon nitride crystal particles in the enlarged photograph are taken as the major axes. This operation is carried out for two enlarged photographs (two enlarged photographs of a unit area of 100 µm×100 µm). The average value of the major axes of silicon nitride crystal particles in the enlarged photographs is taken as the average particle diameter, and the largest major axis is taken as the maximum diameter. The proportion of the maximum diameter of the major axes of silicon nitride crystal particles to substrate thickness was obtained by [(the maximum diameter of the major axes of silicon nitride crystal particles/the thickness of the silicon nitride substrate)×100(%)]. The results are shown in the following Table 4 and Table 5.

TABLE 4

| Sample No. | Composition of Compound Crstals |
|---|---|
| Example 1 | $Y_{1.6}Hf_{0.3}O_3$ Crystal, $Y_{0.5}Hf_{0.5}O_{1.75}$ Crystal, $Y_{0.1}Hf_{0.9}O_{1.95}$ Crystal |
| Example 2 | $Y_{1.6}Hf_{0.3}O_3$ Crystal, $Y_{0.5}Hf_{0.5}O_{1.75}$ Crystal |
| Example 3 | $Y_{1.6}Hf_{0.3}O_3$ Crystal, $Y_{0.5}Hf_{0.5}O_{1.75}$ Crystal, $Y_{0.1}Hf_{0.9}O_{1.95}$ Crystal |
| Example 4 | $Y_{1.6}Hf_{0.3}O_3$ Crystal, $Y_{0.5}Hf_{0.5}O_{1.75}$ Crystal |
| Example 5 | $Y_{1.6}Hf_{0.3}O_3$ Crystal, $Y_{0.5}Hf_{0.5}O_{1.75}$ Crystal |
| Example 6 | $Y_{1.6}Hf_{0.3}O_3$ Crystal, $Y_{0.5}Hf_{0.5}O_{1.75}$ Crystal |
| Example 7 | $Y_{1.6}Hf_{0.3}O_3$ Crystal, $Y_{0.5}Hf_{0.5}O_{1.75}$ Crystal |
| Example 8 | $Y_{1.57}Hf_{0.32}O_3$ Crystal, $Er_4Hf_3O_{12}$ Crystal, $Er_{0.6}Hf_3O_{1.67}$ Crystal |
| Example 9 | $Y_{1.6}Hf_{0.3}O_3$ Crystal, $Y_{0.5}Hf_{0.5}O_{1.75}$ Crystal |
| Example 10 | $Y_{1.6}Hf_{0.3}O_3$ Crystal, $Y_{0.5}Hf_{0.5}O_{1.75}$ Crystal, $Y_{0.1}Hf_{0.9}O_{1.95}$ Crystal |
| Example 11 | $Y_{1.6}Hf_{0.3}O_3$ Crystal, $Y_{0.5}Hf_{0.5}O_{1.75}$ Crystal |
| Comparative Example 1 | $Y_{0.5}Hf_{0.5}O_{1.75}$ Crystal, $Y_{0.1}Hf_{0.9}O_{1.95}$ Crystal |
| Comparative Example 2 | $Y_{0.5}Hf_{0.5}O_{1.75}$ Crystal, $Er_{1.57}Hf_{0.32}O_3$ Crystal |

TABLE 5

| Sample No. | Porosity (%) | Maximum Diameter of Pores (µm) | Maximum Diameter of Grain Boundary Phase (µm) | Average Particle Diameter of Major Axes (µm) | Maximum Particle Diameter of Major Axes of Silicon Nitride Crystal particles (µm) | Proportion of Maximum Diameter of Major axes of Silicon Nitride Crystal Particles to Substrate Thickness (%) |
|---|---|---|---|---|---|---|
| Example 1 | 1.0 | 0.5 | 10 | 8 | 60 | 10 |
| Example 2 | 0.8 | 0.5 | 8 | 7 | 50 | 16 |
| Example 3 | 1.5 | 0.5 | 8 | 7 | 50 | 18 |
| Example 4 | 0.5 | 0.3 | 6 | 5 | 40 | 16 |
| Example 5 | 0.3 | 0.2 | 8 | 5 | 30 | 10 |
| Example 6 | 0.3 | 0.2 | 8 | 5 | 30 | 15 |

TABLE 5-continued

| Sample No. | Porosity (%) | Maximum Diameter of Pores (μm) | Maximum Diameter of Grain Boundary Phase (μm) | Average Particle Diameter of Major Axes (μm) | Maximum Particle Diameter of Major Axes of Silicon Nitride Crystal particles (μm) | Proportion of Maximum Diameter of Major axes of Silicon Nitride Crystal Particles to Substrate Thickness (%) |
|---|---|---|---|---|---|---|
| Example 7 | 0.7 | 0.5 | 8 | 7 | 50 | 16 |
| Example 8 | 0.8 | 0.3 | 6 | 5 | 50 | 20 |
| Example 9 | 0.3 | 0.5 | 8 | 5 | 40 | 13 |
| Example 10 | 0.8 | 0.5 | 10 | 8 | 60 | 19 |
| Example 11 | 1.0 | 0.6 | 3 | 3 | 30 | 10 |
| Comparative Example 1 | 2.0 | 0.8 | 12 | 10 | 80 | 32 |
| Comparative Example 2 | 1.0 | 0.5 | 10 | 10 | 100 | 31 |

As is clear from the results shown in the above tables, the silicon nitride substrate according to each of the Examples satisfied a desired ranges of each prescribed item.

Next, regarding the silicon nitride substrates according to the Examples and the Comparative Examples, dielectric voltage was measured. The dielectric voltage (dielectric strength) was measured by a four-terminal method according to JIS-C-2141. For measurement terminals, those having spherical electrodes having a diameter of 20 mm at tips were used. The measurement of the dielectric strength was carried out in Fluorinert.

In addition, a v-t test was also performed. The v (voltage)-t (time) test is a test that examines whether dielectric breakdown occurs or not after a voltage 50% of dielectric breakdown voltage is continuously applied for 24 hours.

In addition, the frequency dependence of the relative dielectric constant was examined. The frequency dependence of the relative dielectric constant was obtained by $(\varepsilon r_{50} - \varepsilon r_{1000})/\varepsilon r_{50}$, wherein the relative dielectric constant at 50 Hz is $\varepsilon r_{50}$, and the relative dielectric constant at 1 kHz is $\varepsilon r_{1000}$. The calculation results are shown in the following Table 6.

TABLE 6

| Sample No. | Dielectric Voltage (kV/mm) | v-t Test (Dielectric Breakdown occurs or not) | Frequency Dependence of Relative Dielectric Constant: $(\varepsilon_{r\text{-}50}-\varepsilon_{r\text{-}1000})/\varepsilon_{r\text{-}50}$ |
|---|---|---|---|
| Example 1 | 22 | None | 0.025 |
| example 2 | 25 | None | 0.005 |
| Example 3 | 25 | None | 0.020 |
| Example 4 | 28 | None | 0.005 |
| Example 5 | 30 | None | 0.003 |
| Example 6 | 30 | None | 0.002 |
| Example 7 | 27 | None | 0.007 |
| Example 8 | 25 | None | 0.015 |
| Example 9 | 28 | None | 0.014 |
| Example 10 | 20 | None | 0.027 |
| Example 11 | 22 | None | 0.010 |
| Comparative Example 1 | 15 | Occurred | 0.120 |
| Comparative Example 2 | 20 | None | 0.040 |

The silicon nitride substrates according to the Examples had excellent dielectric voltage. In addition, the v-t test result was also good, and the long-term reliability of insulating properties was also good. In addition, also for the frequency dependence of the relative dielectric constant, an excellent value, 0.020 or less, was shown. It became clear that even if the silicon nitride substrates were thinned, the insulating properties were excellent.

Examples 1A to 11A and Comparative Examples 1A and 2A

Copper plates were bonded to the silicon nitride substrates according to Examples 1 to 11 and Comparative Examples 1 and 2 thereby to make silicon nitride circuit boards. For the sizes of the copper plates, those shown in Table 7 were used. The bonding of the copper plates was carried out by an active metal bonding method using an active metal brazing material comprising Ag (the remainder)-Cu (28 wt %)-Ti (3 wt %). The bonding step was carried out by a heat treatment at 850° C.

TABLE 7

| | | Copper Plates (Length mm × Width mm × Thickness mm) | |
|---|---|---|---|
| Sample No. | Silicon Nitride Substrate | Front Side Copper Plate | Rear Side Copper Plate |
| Example 1A | Example 1 | 30 × 15 × 0.5 | 30 × 15 × 0.5 |
| Example 2A | Example 2 | 30 × 15 × 0.5 | 30 × 15 × 0.5 |
| Example 3A | Example 3 | 30 × 15 × 0.5 | 30 × 15 × 0.5 |
| Example 4A | Example 4 | 30 × 20 × 0.7 | 30 × 20 × 0.7 |
| Example 5A | Example 5 | 30 × 20 × 1.0 | 35 × 25 × 0.7 |
| Example 6A | Example 6 | Two Pieces of 20 × 10 × 0.7 | 35 × 25 × 0.5 |
| Example 7A | Example 7 | 30 × 15 × 0.5 | 30 × 15 × 0.5 |
| Example 8A | Example 8 | 30 × 20 × 0.7 | 30 × 20 × 0.7 |
| Example 9A | Example 9 | 30 × 20 × 1.0 | 35 × 25 × 0.7 |
| Example 10A | Example 10 | 30 × 20 × 1.0 | 35 × 25 × 0.7 |
| Example 11A | Example 11 | 30 × 15 × 0.5 | 35 × 15 × 0.5 |
| Comparative Example 1A | Comparative Example 1 | <As the same as in Example 1> | <As the same as in Example 1> |
| Comparative Example 2A | Comparative Example 2 | <As the same as in Example 1> | <As the same as in Example 1> |

A TCT (Thermal Cycle Test) was performed on the silicon nitride circuit boards according to the Examples and the Comparative Examples. This TCT was performed with one cycle of −50° C.×30 minutes→room temperature×10 minutes→200° C.×30 minutes→room temperature×10 minutes, and the presence or absence of cracks in the silicon nitride substrate and the proportion of decrease in dielectric voltage were measured after 5000 cycles. The presence or absence of cracks in the silicon nitride substrate was measured by a fluorescent flaw detection method with the copper plates peeled. The proportion of decrease in dielectric voltage was obtained by comparing dielectric voltage before the TCT and dielectric voltage after the TCT. Specifically, the proportion of decrease in dielectric voltage was obtained by [(dielectric voltage before the test−dielectric voltage after the test)/(dielectric voltage before the test)×100(%)]. The measurement results are shown in the following Table 8.

TABLE 8

| Sample No. | Absence or Presence of Cracks in Silicon Nitride Substrate after TCT | Proportion of Decrease in Dielectric Voltage (%) |
|---|---|---|
| Example 1A | None | 5 |
| Example 2A | None | 5 |
| Example 3A | None | 5 |
| Example 4A | None | 0 |
| Example 5A | None | 0 |
| Example 6A | None | 0 |
| Example 7A | None | 0 |
| Example 8A | None | 5 |
| Example 9A | None | 0 |
| Example 10A | None | 6 |
| Example 11A | None | 5 |
| Comparative Example 1A | Presented | Unmeasurable (Due to Crack Formation) |
| Comparative Example 2A | None | 8 |

The silicon nitride circuit board according to each of the Examples exhibited excellent TCT characteristics. In addition, the proportion of decrease in dielectric voltage was also small. Therefore, it became clear that even if the silicon nitride substrates were thinned, or the copper plates were thickened, excellent durability was obtained.

Some embodiments of the present invention have been explained and illustrated above, but these embodiments are presented as examples and are not intended to limit the scope of the invention. These novel embodiments can be carried out in other various forms, and various omissions, replacements, changes, and the like can be made without departing from the spirit of the invention. These embodiments and modifications thereof are included in the scope and spirit of the invention and included in the invention described in the claims and an equivalent scope thereof. In addition, the above-described embodiments can be carried out in combination with each other.

REFERENCE SIGNS LIST

1 . . . silicon nitride substrate
2 . . . silicon nitride circuit board
3 . . . front metal plate
4 . . . back metal plate
5 . . . silicon nitride crystal particle
6 . . . grain boundary phase

The invention claimed is:

1. A high thermal conductive silicon nitride sintered body having a thermal conductivity of 50 W/m·K or more and a three-point bending strength of 600 MPa or more,
wherein highest peak intensities detected at diffraction angles of 29.3±0.2°, 29.7±0.2°, 27.0±0.2°, and 36.1±0.2° are expressed as $I_{29.3°}$, $I_{29.7°}$, $I_{27.0°}$, and $I_{36.1°}$, respectively, the highest peak intensities being detected by XRD analysis for an arbitrary cross section of the silicon nitride sintered body, whereby a peak ratio $(I_{29.3°})/(I_{27.0°}+I_{36.1°})$ satisfies a range of 0.01 to 0.08, and a peak ratio $(I_{29.7°})/(I_{27.0°}+I_{36.1°})$ satisfies a range of 0.02 to 0.16, and
the $I_{29.3°}$ and $I_{29.7°}$ correspond to peaks depending on a rare earth element-hafnium-oxygen compound crystal.

2. The high thermal conductive silicon nitride sintered body according to claim 1, wherein the $I_{27.0°}$ and $I_{36.1°}$ correspond to peaks depending on a β-$Si_3N_4$ crystal.

3. The high thermal conductive silicon nitride sintered body according to claim 2, wherein the rare earth element-hafnium-oxygen compound crystal comprises two or more types of compound crystals having same constituent elements and different composition ratios.

4. The high thermal conductive silicon nitride sintered body according to claim 1, wherein a sum of the peak ratio $(I_{29.3°})/(I_{27.0°}+I_{36.1°})$ and the peak ratio $(I_{29.7°})/(I_{27.0°}+I_{36.1°})$ satisfies a range of 0.03 to 0.20.

5. The high thermal conductive silicon nitride sintered body according to claim 1, wherein when a highest peak intensity detected at 34.8±0.2° is expressed as $I_{34.8°}$, a peak ratio $(I_{34.8°})/(I_{27.0°}+I_{36.1°})$ is 0.02 or less (including zero).

6. The high thermal conductive silicon nitride sintered body according to claim 2, wherein the rare earth element-hafnium-oxygen compound crystal comprises two or more types selected from a $Y_{1.6}Hf_{0.3}O_3$ crystal, a $Y_{0.5}Hf_{0.5}O_{1.75}$ crystal, and a $Y_{0.1}Hf_{0.9}O_{1.95}$ crystal.

7. The high thermal conductive silicon nitride sintered body according to claim 1, comprising yttrium.

8. The high thermal conductive silicon nitride sintered body according to claim 1, wherein a maximum diameter of a grain boundary phase is 10 µm or less in an arbitrary cross section of the silicon nitride sintered body.

9. The high thermal conductive silicon nitride sintered body according to claim 1, wherein an average particle diameter of major axes of silicon nitride crystal particles is 1 to 10 µm.

10. The high thermal conductive silicon nitride sintered body according to claim 1, wherein a porosity of the sintered body is 3% or less (including zero).

11. The high thermal conductive silicon nitride sintered body according to claim 1, wherein when a relative dielectric constant at 50 Hz is expressed as $εr_{50}$, and a relative dielectric constant at 1 kHz is expressed as $εr_{1000}$, the sintered body satisfies a relation: $(εr_{50}-εr_{1000})/εr_{50} ≤ 0.1$.

12. A silicon nitride substrate comprising the high thermal conductive silicon nitride sintered body according to claim 1.

13. The silicon nitride substrate according to claim 12, wherein a thickness of the silicon nitride substrate is 0.10 mm or more and 0.70 mm or less.

14. The silicon nitride substrate according to claim 13, wherein the thickness of the silicon nitride substrate is 0.10 mm or more and less than 0.30 mm.

15. The silicon nitride substrate according to claim 12, wherein a maximum diameter of the major axes of the silicon nitride crystal particles in the high thermal conductive silicon nitride sintered body is 20% or less of the thickness of the silicon nitride substrate.

16. A silicon nitride circuit board, wherein a metal plate is bonded to the silicon nitride substrate according to claim 12.

17. The silicon nitride circuit board according to claim 16, wherein a plurality of metal plates are bonded to at least one surface of the silicon nitride substrate.

18. The silicon nitride circuit board according to claim 16, wherein a thickness of at least one metal plate is 0.70 mm or more.

19. A semiconductor apparatus, wherein a semiconductor chip is mounted on the silicon nitride circuit board according to claim 16.

20. The high thermal conductive silicon nitride sintered body according to claim 1, wherein a dielectric voltage level of the silicon nitride sintered body is 10 kV/mm or more.

21. The high thermal conductive silicon nitride sintered body according to claim 1, wherein a rear earth element of the rare earth element-hafnium-oxygen does not include an element other than yttrium.

22. The high thermal conductive silicon nitride sintered body according to claim 21, wherein the rare earth element-hafnium-oxygen compound crystal comprises two or more types selected from a $Y_{1.6}Hf_{0.3}O_3$ crystal, a $Y_{0.5}Hf_{0.5}O_{1.75}$ crystal, and a $Y_{0.1}Hf_{0.9}O_{1.95}$ crystal.

23. The high thermal conductive silicon nitride sintered body according to claim 22, wherein an average particle diameter of major axes of silicon nitride crystal particles is 1 to 10 μm.

24. The high thermal conductive silicon nitride sintered body according to claim 23, wherein when a relative dielectric constant at 50 Hz is expressed as $\varepsilon r_{50}$, and a relative dielectric constant at 1 kHz is expressed as $\varepsilon r_{1000}$, the sintered body satisfies a relation: $(\varepsilon r_{50}-\varepsilon r_{1000})/\varepsilon r_{50} \leq 0.1$.

* * * * *